US008877565B2

(12) United States Patent
Li et al.

(10) Patent No.: US 8,877,565 B2
(45) Date of Patent: Nov. 4, 2014

(54) METHOD OF FORMING A MULTILAYER SUBSTRATE CORE STRUCTURE USING SEQUENTIAL MICROVIA LASER DRILLING AND SUBSTRATE CORE STRUCTURE FORMED ACCORDING TO THE METHOD

(75) Inventors: Yonggang Li, Chandler, AZ (US); Islam Salama, Chandler, AZ (US); Charan Gurumurthy, Higley, AZ (US)

(73) Assignee: Intel Corporation, Santa Clara, CA (US)

( * ) Notice: Subject to any disclaimer, the term of this patent is extended or adjusted under 35 U.S.C. 154(b) by 344 days.

(21) Appl. No.: 11/769,852

(22) Filed: Jun. 28, 2007

(65) Prior Publication Data
US 2009/0001550 A1    Jan. 1, 2009

(51) Int. Cl.
H01L 21/00    (2006.01)
H05K 3/46    (2006.01)
H05K 3/42    (2006.01)
H05K 3/00    (2006.01)

(52) U.S. Cl.
CPC .............. *H05K 3/422* (2013.01); *H05K 3/4602* (2013.01); *H05K 3/0035* (2013.01); *H05K 2201/09563* (2013.01); *H05K 3/4652* (2013.01); *H05K 2201/0394* (2013.01)
USPC ............................ 438/125; 438/584; 361/751

(58) Field of Classification Search
CPC ......... H01L 23/14; H01L 23/52; H01L 29/40; H05K 3/4644
USPC .......... 438/928, 940, 690, 584; 257/E23.003, 257/E23.007, E23.586, E23.596, E23.578, 257/E23.577; 361/751, 779; 427/437; 205/126
See application file for complete search history.

(56) References Cited

U.S. PATENT DOCUMENTS 4,299,873 A    11/1981    Ogihara et al.
5,543,182 A *    8/1996    Joshi et al. ................. 427/443.1
(Continued)

FOREIGN PATENT DOCUMENTS

EP    1 096 842 A1    5/2001
EP    1 858 307 A1    11/2007
(Continued)

OTHER PUBLICATIONS

"Electroless Plating: Fundamentals and Applications" ed. By G.O. Mallory and J.B. Hajdu, © 1990 Wiiliam Andrew Publishing/Noyes, p. vii, §1, lines 9-10.*

(Continued)

*Primary Examiner* — Caridad Everhart
(74) *Attorney, Agent, or Firm* — Schwabe, Williamson & Wyatt, P.C.

(57) ABSTRACT

A method of fabricating a substrate core structure, and a substrate core structure formed according to the method. The method includes: laser drilling a first set of via openings through a starting insulating layer; filling the first set of via openings with a conductive material to provide a first set of conductive vias; providing first and second patterned conductive layers on opposite sides of the starting insulating layer; providing a supplemental insulating layer onto the first patterned conductive layer; laser drilling a second set of via openings through the supplemental insulating layer; filling the second set of via openings with a conductive material to provide a second set of conductive vias; and providing a supplemental patterned conductive layer onto an exposed side of the supplemental insulating layer, the second set of conductive vias contacting the first patterned conductive layer and the supplemental patterned conductive layer at opposite sides thereof.

13 Claims, 8 Drawing Sheets

(56) References Cited

U.S. PATENT DOCUMENTS

| | | | |
|---|---|---|---|
| 5,710,071 | A | 1/1998 | Beddingfield et al. |
| 5,780,143 | A | 7/1998 | Shimamoto et al. |
| 5,826,330 | A | 10/1998 | Isoda et al. |
| 6,121,553 | A | 9/2000 | Shinada et al. |
| 6,165,820 | A * | 12/2000 | Pace .............................. 438/125 |
| 6,165,892 | A | 12/2000 | Chazan et al. |
| 6,211,485 | B1 | 4/2001 | Burgess |
| 6,242,282 | B1 * | 6/2001 | Fillion et al. ................... 438/106 |
| 6,254,971 | B1 | 7/2001 | Katayose et al. |
| 6,310,391 | B1 | 10/2001 | Nagasawa et al. |
| 6,320,140 | B1 | 11/2001 | Enomoto |
| 6,353,999 | B1 | 3/2002 | Cheng |
| 6,424,282 | B1 * | 7/2002 | Maenza ......................... 341/144 |
| 6,585,811 | B2 * | 7/2003 | Palmans et al. .............. 106/1.23 |
| 6,590,165 | B1 | 7/2003 | Takada et al. |
| 6,613,413 | B1 | 9/2003 | Japp et al. |
| 6,631,558 | B2 | 10/2003 | Burgess |
| 6,739,040 | B1 | 5/2004 | Nakamura et al. |
| 6,930,987 | B1 * | 8/2005 | Fukuda et al. ................. 370/328 |
| 7,198,996 | B2 | 4/2007 | Nakatani et al. |
| 7,211,289 | B2 | 5/2007 | Larnerd et al. |
| 7,230,188 | B1 * | 6/2007 | En et al. ......................... 174/257 |
| 7,300,857 | B2 | 11/2007 | Akram et al. |
| 7,371,974 | B2 | 5/2008 | Toyoda et al. |
| 7,674,987 | B2 | 3/2010 | Kodama et al. |
| 7,683,458 | B2 | 3/2010 | Akram et al. |
| 7,696,613 | B2 * | 4/2010 | Nakamura et al. ............ 257/668 |
| 2003/0071608 | A1 | 4/2003 | Chen et al. |
| 2003/0135994 | A1 | 7/2003 | Shutou et al. |
| 2003/0136577 | A1 | 7/2003 | Abe |
| 2004/0212030 | A1 | 10/2004 | Asai |
| 2004/0227227 | A1 | 11/2004 | Imanaka et al. |
| 2005/0098868 | A1 | 5/2005 | Chang et al. |
| 2005/0136646 | A1 | 6/2005 | Larnerd et al. |
| 2005/0142033 | A1 * | 6/2005 | Glezer et al. ..................... 422/58 |
| 2005/0218451 | A1 * | 10/2005 | Jobetto .......................... 257/347 |
| 2005/0236177 | A1 | 10/2005 | Inagaki et al. |
| 2006/0001166 | A1 | 1/2006 | Igarashi et al. |
| 2006/0057340 | A1 | 3/2006 | Umeda et al. |
| 2006/0060956 | A1 * | 3/2006 | Tanikella ....................... 257/686 |
| 2006/0125072 | A1 * | 6/2006 | Mihara .......................... 257/686 |
| 2006/0178007 | A1 * | 8/2006 | Nakamura et al. ............ 438/675 |
| 2006/0185141 | A1 * | 8/2006 | Mori et al. .................... 29/25.41 |
| 2006/0220167 | A1 | 10/2006 | Min et al. |
| 2007/0023202 | A1 * | 2/2007 | Shibata et al. ................. 174/250 |
| 2007/0029106 | A1 | 2/2007 | Kato |
| 2007/0044999 | A1 | 3/2007 | Shibata et al. |
| 2007/0048447 | A1 * | 3/2007 | Lee et al. ....................... 427/305 |
| 2007/0057375 | A1 * | 3/2007 | Nakamura .................... 257/758 |
| 2007/0096328 | A1 * | 5/2007 | Takahashi et al. ............ 257/774 |
| 2007/0132937 | A1 | 6/2007 | Kim et al. |
| 2007/0181994 | A1 | 8/2007 | Fukase et al. |
| 2007/0200211 | A1 * | 8/2007 | Kobayashi et al. ........... 257/676 |
| 2007/0273047 | A1 | 11/2007 | Nakai et al. |
| 2007/0281471 | A1 | 12/2007 | Hurwitz et al. |
| 2008/0052904 | A1 * | 3/2008 | Schneider et al. ............... 29/846 |
| 2008/0247704 | A1 | 10/2008 | Kodama et al. |
| 2008/0264681 | A1 | 10/2008 | Iwai et al. |
| 2008/0285910 | A1 | 11/2008 | Yamada et al. |
| 2008/0289866 | A1 | 11/2008 | Yuri et al. |
| 2009/0001550 | A1 | 1/2009 | Li et al. |
| 2009/0002958 | A1 | 1/2009 | Li et al. |

FOREIGN PATENT DOCUMENTS

| | | |
|---|---|---|
| JP | 64-032657 | 2/1989 |
| JP | 2001-193743 | 7/2001 |
| JP | 2003-69226 | 8/2001 |
| JP | 2005-005417 | 6/2003 |
| JP | 2004-259795 | 9/2004 |
| JP | 2005-005417 | 1/2005 |
| JP | 2005-123397 | 5/2005 |
| KR | 10-2007-0034766 | 3/2007 |
| WO | WO 2007/007857 A1 | 1/2007 |

OTHER PUBLICATIONS

International Search Report, PCT/US2008/067847, Sep. 26, 2008, 11 pages.

English Translation of Korean Patent Application No. 2009-7027069, Notice of Preliminary Rejection dated Jun. 8, 2011 corresponding to U.S. Appl. No. 11/769,852.

Chinese Patent Application No. 200880022291.7, Notice of First Office Action dated May 4, 2011 corresponding to U.S. Appl. No. 11/769,852.

Taiwan Patent Application No. 097123727, Office Action in Primary Examination dated Jul. 24, 2011 corresponding to U.S. Appl. No. 11/769,852, Sep. 5, 2011.

Office Action mailed Aug. 23, 2010, U.S. Appl. No. 11/769,900, filed Jun. 28, 2007, Sep. 5, 2011.

Office Action mailed Dec. 6, 2010, U.S. Appl. No. 11/769,900, filed Jun. 28, 2007.

Office Action mailed May 26, 2011, U.S. Appl. No. 11/769,900, filed Jun. 28, 2007.

Chinese Patent Application No. 200880022013.1 Notice of First Office Action dated Dec. 31, 2010 corresponding to U.S. Appl. No. 11/769,900.

Translation of Korean Patent Application No. 10-2009-7026882 Notice of Preliminary Rejection dated Jun. 8, 2011 corresponding to U.S. Appl. No. 11/769,900.

Taiwan Patent Application No. 097123929 Office Action Primary Examination dated Jul. 4, 2011 corresponding to U.S. Appl. No. 11/769,900.

English Translation of Japanese Patent Application No. 2010-515011 Notice of Reasons for Rejection dated Dec. 7, 2011 corresponding to U.S. Appl. No. 11/769,852.

English Summary of "Decision of Rejection" and Summary of "Decision to Dismiss the Amendment" dated Dec. 18, 2012 from Japanese Patent Application No. 2010-515011 corresponding to U.S. Appl. No. 11/769,852.

Decision of Rejection for Rejection dated Dec. 4, 2012 from Chinese Patent Application No. 200880022291.7 corresponding to U.S. Appl. No. 11/769,852.

Office Action dated Apr. 29, 2013, Taiwan Patent Application No. 097123727 corresponding to U.S. Appl. No. 12/941,899.

English Summary of Decision of Rejection and Decision to Dismiss the Amendment from Japanese Patent Office dated Dec. 18, 2012, Japanese Patent Application No. 2010-515011 corresponding to U.S. Appl. No. 12/941,899.

Notice of Reason for Rejection dated May 20, 2014, Japanese Patent Application No. 2013-168698 corresponding to U.S. Appl. No. 11/769,900.

Notice of Reexamination for Chinese Application No. 200880022291.7, mailed Jul. 25, 2014.

* cited by examiner

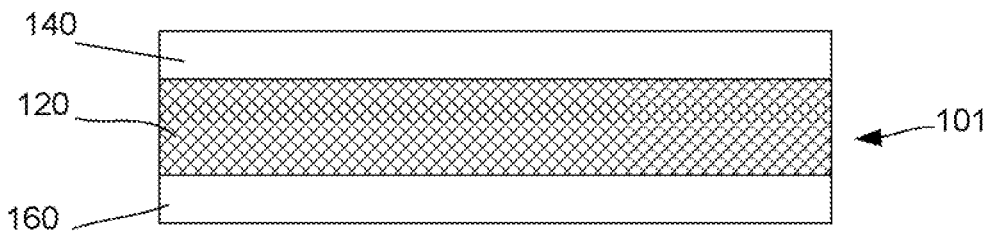
Fig. 1 – Prior Art
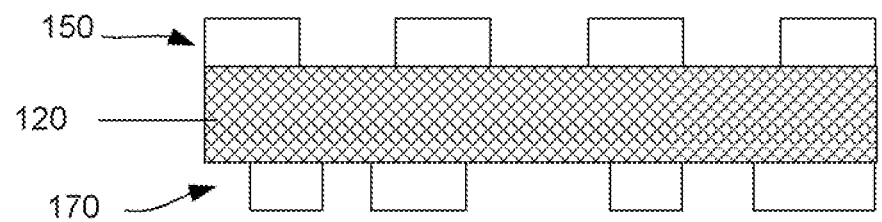
Fig. 2 – Prior Art
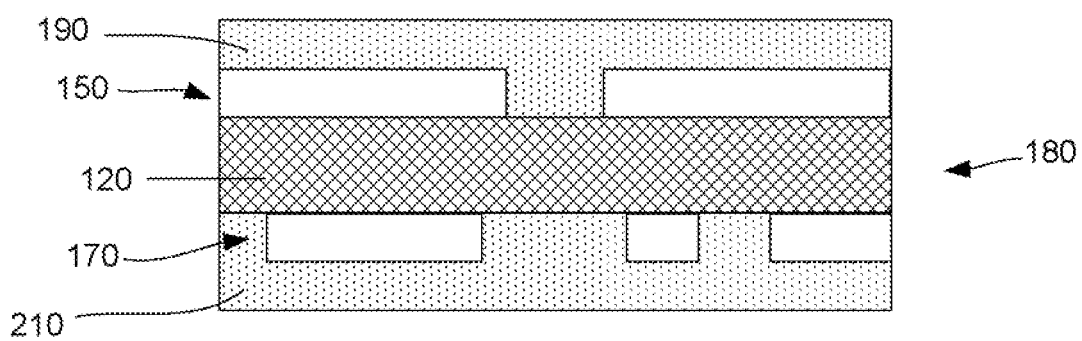
Fig. 3 – Prior Art
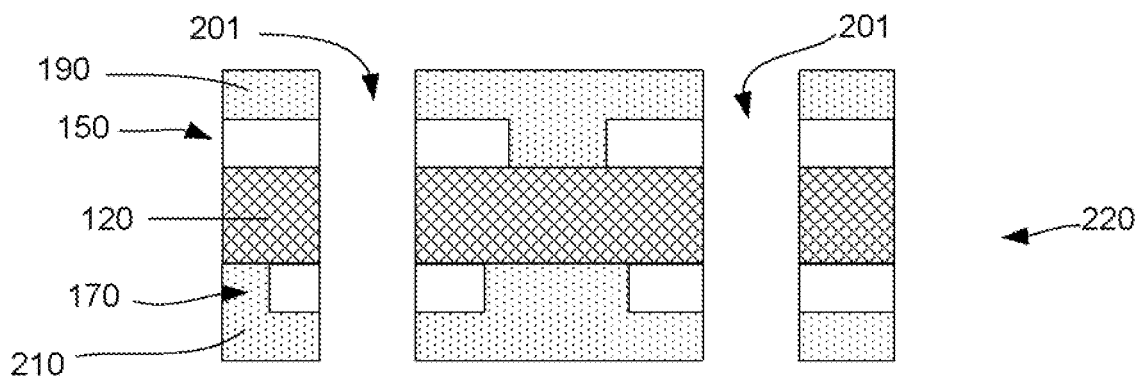
Fig. 4 – Prior Art

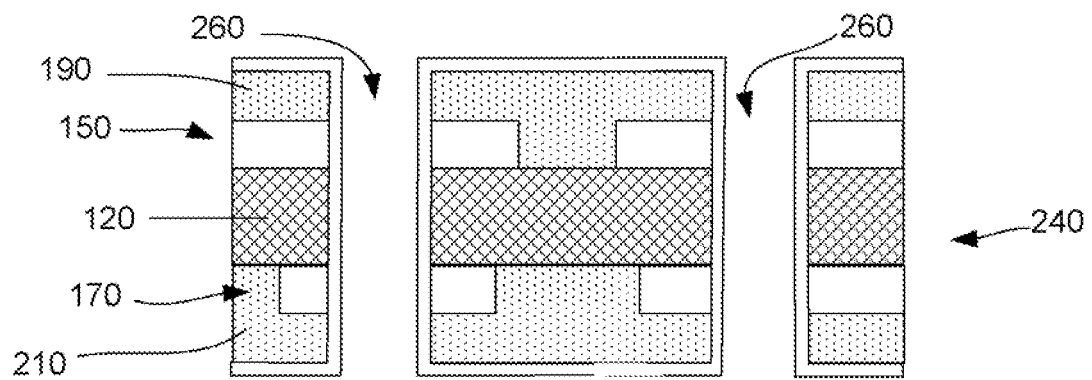
Fig. 5 – Prior Art
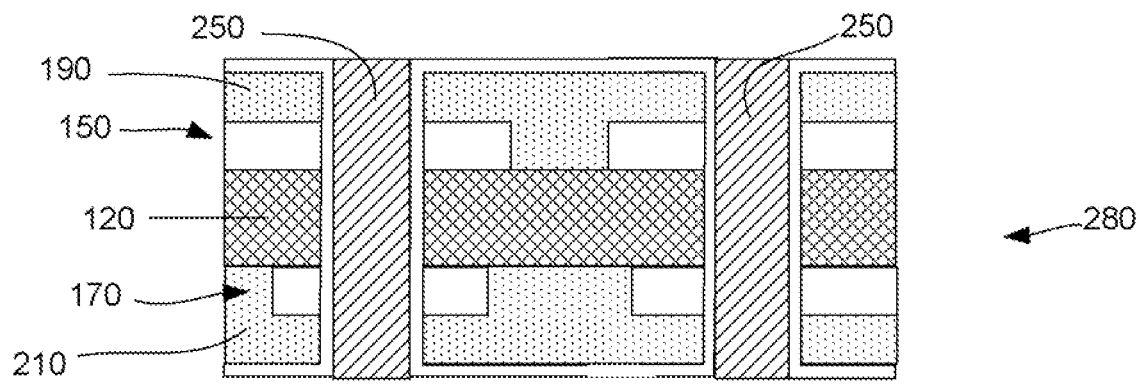
Fig. 6 – Prior Art
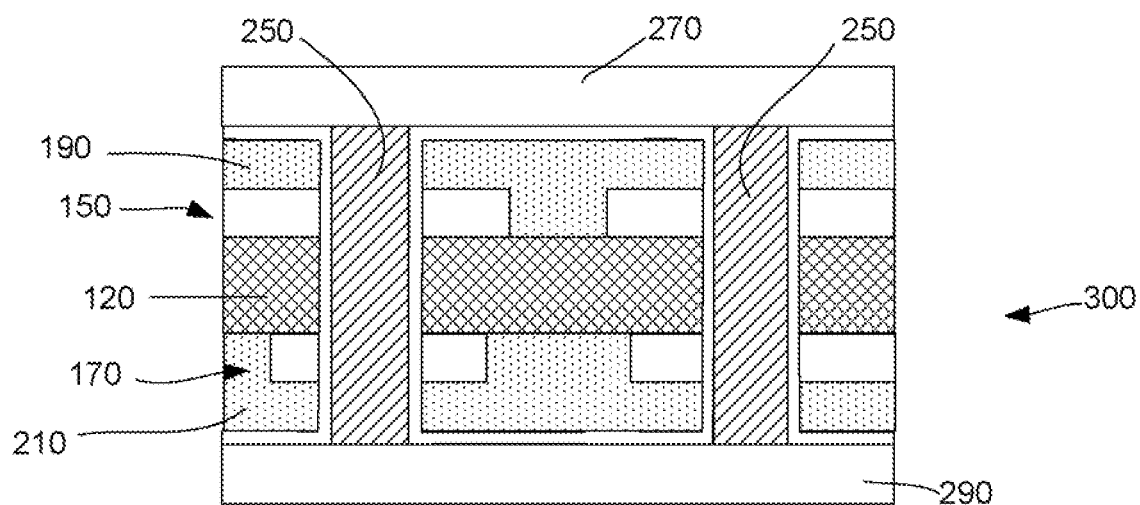
Fig. 7 – Prior Art

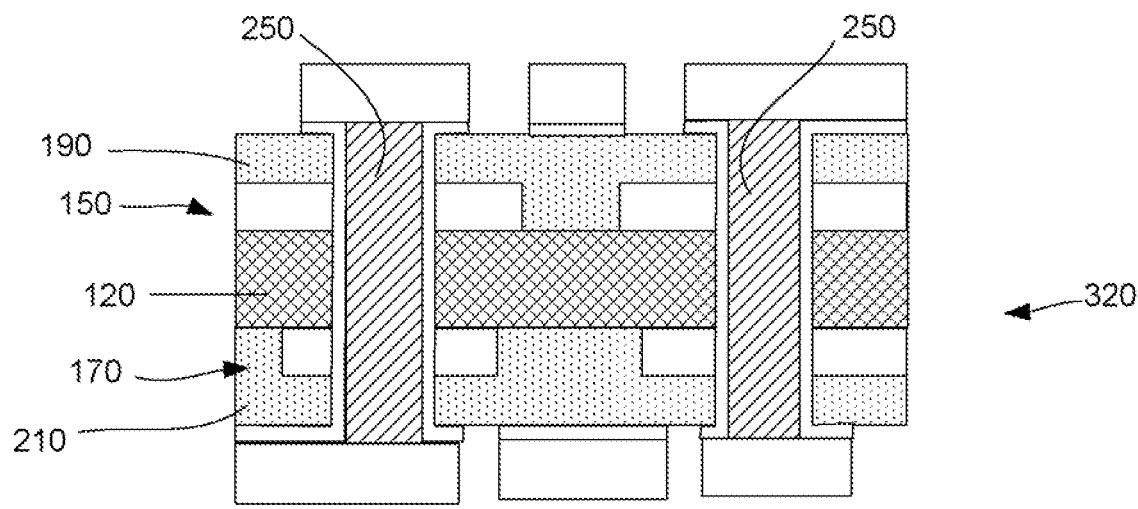
Fig. 8 – Prior Art
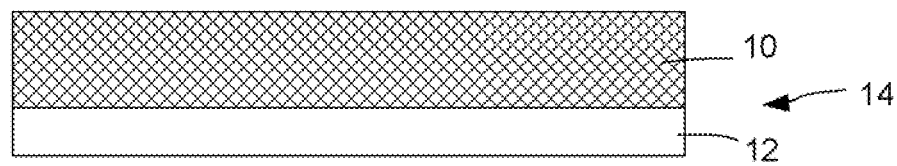
Fig. 9a
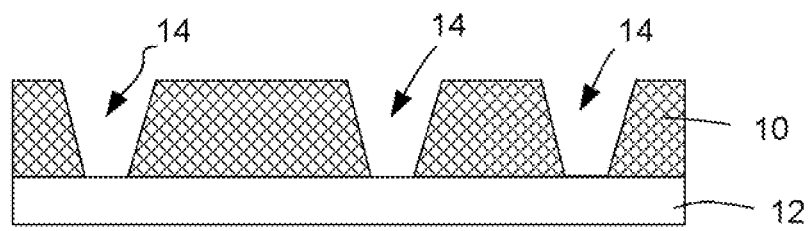
Fig. 9b
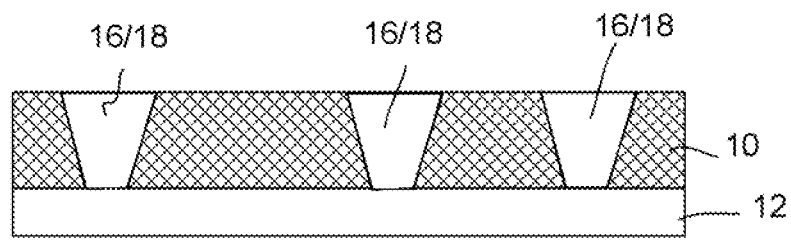
Fig. 9c

METHOD OF FORMING A MULTILAYER SUBSTRATE CORE STRUCTURE USING SEQUENTIAL MICROVIA LASER DRILLING AND SUBSTRATE CORE STRUCTURE FORMED ACCORDING TO THE METHOD

FIELD

Embodiments of the present invention relate generally to the field of multilayer substrate core structure fabrication, and, in particular, to methods for fabricating such a board by laser drilling microvias therein.

BACKGROUND

A multilayer substrate core structure (MPWB) may be conventionally fabricated by first providing a copper clad core. The copper clad core (CCL) may be a laminate that is copper clad on one or two sides depending on application needs. An example of such a fabrication process is shown in FIGS. 1-8. As seen in FIG. 1, a two sided CCL 101 is first provided including an insulating laminate 12 and top and bottom copper films 140 and 160, respectively. As seen in FIG. 2, the top and bottom copper films 140 and 160 are pre-patterned according to pre-determined interconnect patterns to be provided onto the laminate 120: such as by way of etching, to provide patterned copper films 150 and 170. Thereafter, as seen in FIG. 3, dielectric layer, such as ABF layers 190 and 210 (Ajinomoto Build-Up Film), are laminated onto the patterned copper films 150 and 160, and, as seen in FIG. 4 to provide a first intermediate laminate 180. As seen in FIG. 4, the first intermediate laminate 180 is then provided with through holes 201 by way of mechanical drilling and des-mearing to provide a second intermediate laminate 220. The de-smearing involves using a desmear solution to process the board to dissolve and remove any smears caused by drilling. As seen in FIG. 5, the through-holes 201 and the top and bottom surfaces of the intermediate laminate 220 are then plated to provide a plated intermediate laminate 240 with plated through holes 260. As seen in FIG. 6, the plated intermediate laminate 240 may be subjected thereafter to PTH plugging with a conductive material 250 such as copper to yield a plugged intermediate laminate 280. In a next stage, as shown in FIG. 7, the plugged intermediate laminate 280 may be lid plated with a conductive material such as copper to provide lids 270 and 290 on a top and bottom surface thereof the plating occurring on the top and bottom plating existing on laminate 280 of FIG. 6 to yield a lid plated intermediate laminate 300. Thereafter, the copper existing at the top and bottom surfaces of lid plated intermediate laminate 30 is patterned, such as by way of etching, to yield the wiring board 320 as shown in FIG. 8.

Prior art substrate are typically built on the base of a thick core (for example one having a thickness of about 0.7 mm (not including any build-up or conductive layers). The prior art core build up process can be lengthy. Taking a four layer core as an example, the macro process stages of a prior art fabrication process may include all of, core baking and cleaning, core copper patterning, copper roughening, ABF lamination, plated through hole drilling desmear, copper plating, copper roughening, plated through hole plugging, surface flattening, copper plating, and finally, copper patterning. However, mechanical plated through hole drilling can be the most expensive single process in the fabrication of a prior art multilayer substrate core structure. The need for plugging as explained above can add more to the manufacturing costs according to the prior art.

Disadvantageously, substrate core structures for substrate core structures according to the prior art can be costly, and can carry high manufacturing costs as a result of the use of mechanical drilling technology. These costs can skyrocket where the substrate core structures are miniaturized and scaled for future applications. In addition mechanical drilling is not suitable for producing holes smaller than about 150 microns.

The prior art fails to provide a cost-effective, expedient and reliable method of providing a multilayer substrate core structure.

BRIEF DESCRIPTION OF THE DRAWINGS

FIGS. 1-8 show stages of forming a substrate core structure according to the prior art;

FIGS. 9a-9h show stages of forming a substrate core structure according to a first embodiment;

Figure 9D:
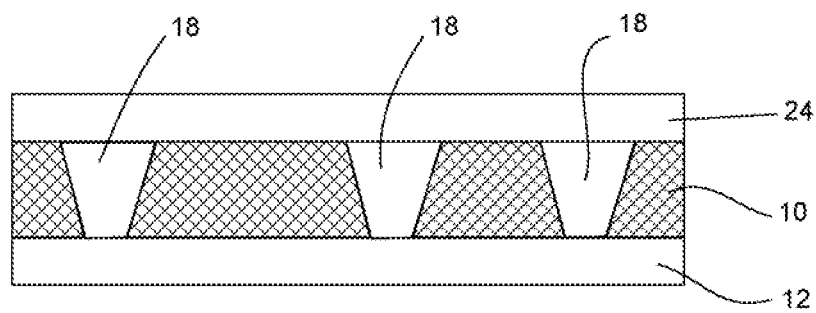

For simplicity and clarity of illustration, elements in the drawings have not necessarily been drawn to scale. For example the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, a method of fabricating a substrate core structure, such as a substrate core structure, a substrate core structure formed according to the method, and a system including the substrate core structure, are disclosed. Reference is made to the accompanying drawings within which are shown, by way of illustration, specific embodiments by which the present invention may be practiced. It is to be understood that other embodiments may exist and that other structural changes may be made without departing from the scope and spirit of the present invention.

The terms on, above, below, and adjacent as used herein refer to the position of one element relative to other elements. As such, a first element disposed on, above, or below a second element may be directly in contact with the second element or it may include one or more intervening elements. In addition, a first element disposed next to or adjacent a second element may be directly in contact with the second element or it may include one or more intervening elements. In addition, in the instant description, figures and/or elements may be referred to in the alternative. In such a case, for example where the description refers to Figs. X/Y showing an element A/B, what is meant is that FIG. X shows element A and FIG. Y shows element B. In addition, a "layer" as used herein may refer to a layer made of a single material, a layer made of a mixture of different components, a layer made of various sub-layers, each sub-layer also having the same definition of layer as set forth above.

Aspects of this and other embodiments will be discussed herein with respect to FIGS. 9a-11 below. FIGS. 9a-9h show stages for the fabrication of a multilayer substrate core structure according to a first method embodiment involving subtractive patterning of the conductive layers, and FIGS. 10a-10h show stages for the fabrication of a multilayer substrate core structure according to a second method embodiment involving semi-additive patterning of the conductive layers, such as for FLS (fine line and space) routing, FIG. 11 shows a system incorporated a multilayer substrate core structure according to an embodiment. The figures, however, should not be taken to be limiting, as it is intended for the purpose of explanation and understanding.

Figure 10A:
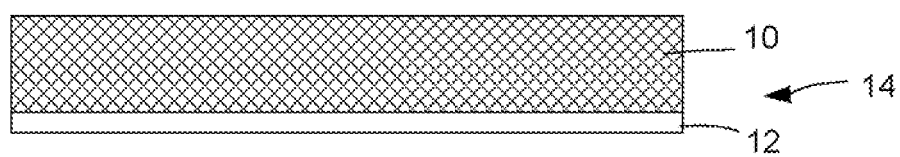
FIGS. 10a-10h show stages of forming a substrate core structure according to a second embodiment.
Figure 11:
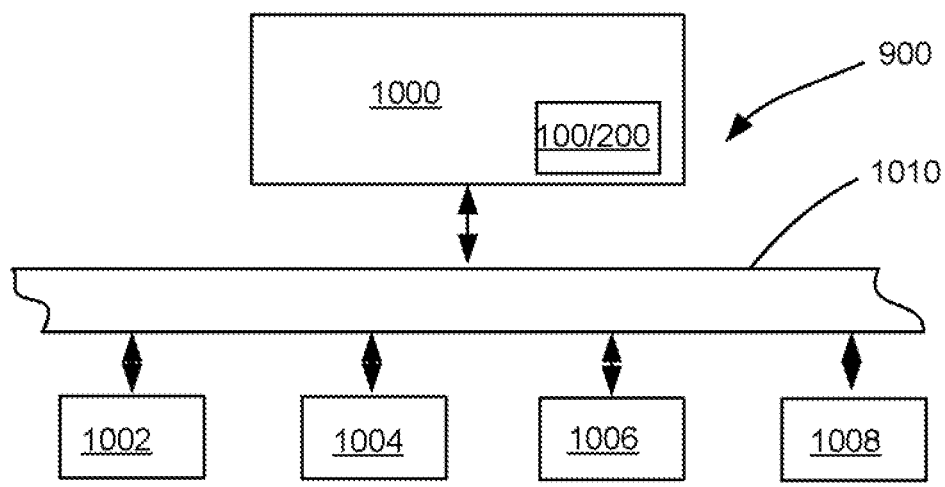
FIG. 11 is a schematic view of an embodiment of a system incorporating a substrate core as shown in either of FIG. 9h or 10h.

Referring to FIGS. 9a and 10a, method embodiments include providing a starting insulating layer 10. The starting insulating layer may include any one of well known core insulating/dielectric materials, such as, for example, glass epoxy resin or bismaleimide-triazine (BT), or ABF. Preferably, the starting insulating layer comprises a fiber reinforced glass epoxy resin. According to one embodiment, as shown in FIGS. 9a and 10a, the starting insulating layer 10 may include an initial conductive layer 12 thereon such as one made of copper, or one made of silver or nickel. In the shown embodiments of FIGS. 9a and 10a, the starting insulating layer 10 may be part of a conventional copper clad core or CCL 14. In the first embodiment, the initial conductive layer 12 may, for example, have a thickness between about 50 and about 70 microns, whereas, in the second embodiment as shown in FIG. 10a, the initial conductive layer 12 may have a thickness between about 1 micron and about 2 microns.

Figure 10B:
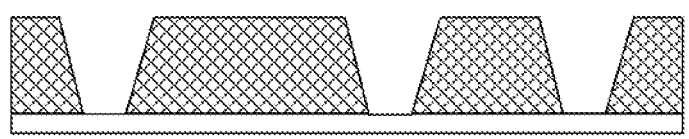

Referring next to FIGS. 9b and 10b, embodiments include laser drilling a first set of via openings 14 through the starting insulating layer 10 as shown. In the shown embodiments, the vias extend to the conductive layer 12. For laser drilling, a carbon dioxide gas laser beam, an ultraviolet laser beam or an excimer laser beam may be used. For example, an embodiment contemplates using a carbon dioxide laser on a glass fiber reinforced starting insulating layer having a power range between about 1 to about 10 mJ, and a pulse width between about 1 and about 100 ms. The determination of laser drilling parameters would be, among others, a function of the material being laser drilled, its thickness, and the dimensions of the via to be provided.

Figure 10C:
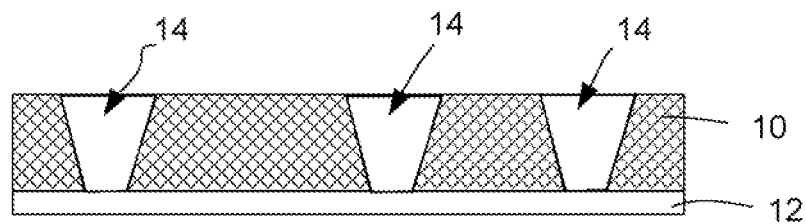

Referring next to FIGS. 9c and 10c, embodiments include filling the first set of via openings 14 with a conductive material 16 to provide a first set of conductive vias 18 as shown. According to a preferred embodiment, provision of the conductive material 16 may be effected by way of selective fast electroless plating. Preferably, the conductive material 16 includes copper, but it may also include nickel and/or silver. In the embodiment of FIG. 10c, the provision of the conductive material 16 may also be effected by way of selective fast electroless plating. As is well known, selective fast electroless copper plating may be achieved by using an electroless plating solution which includes a catalyst therein, that is, a substance present in an amount such that a substantially increased deposition rate of the material to be plated is obtained in comparison with a solution where the catalyst is not present, the catalyst further having the property of depositing itself only on the copper area of the initial conductive layer in order to allow the provision of selective fast electroless plating.

Figure 9E:
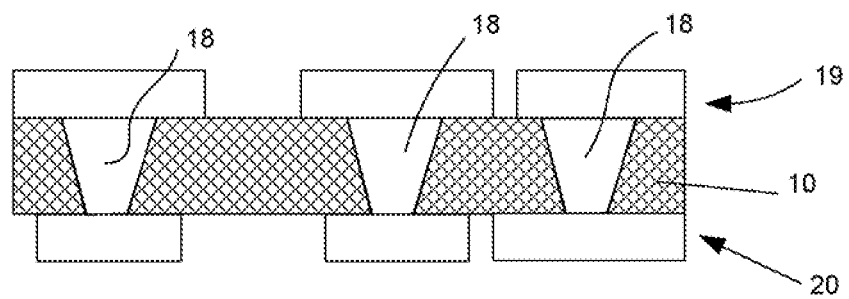
Figure 10D:
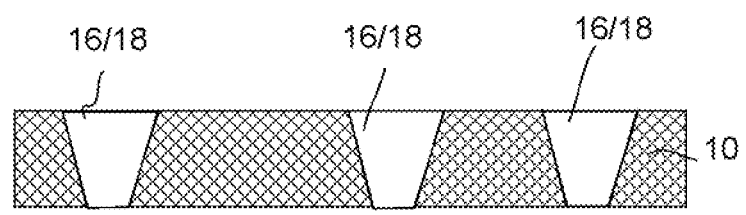
Figure 10E:
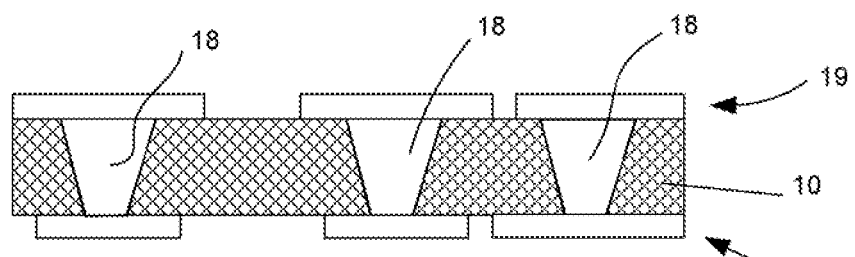

Referring next to FIGS. 9d and 9e on the one hand, and to FIGS. 10d and 10e on the other hand, method embodiments include providing a first patterned conductive layer 19 on one side of the starting insulating layer 10, and a second patterned conductive layer 20 on another side of the starting insulating layer 10. According to the first embodiment as shown in FIGS. 9d and 9e, providing the first patterned conductive layer includes patterning the initial conductive layer 12 by way of etching, and providing the second patterned conductive layer includes providing a second conductive layer 24 onto a side of the starting insulating layer 10 opposite the side including the initial conductive layer 12, and then patterning the second conductive layer 24, such as, for example, by way of etching. Preferably, the second conductive layer 24 is provided by laminating the second conductive layer 24 onto the starting insulating layer 10. According to the second embodiment as shown in FIGS. 10d and 10e, providing the first patterned conductive layer 19 includes removing, such as, for example, by way of etching, the initial conductive layer 12 after filling the first set of via openings 14, and then providing the first patterned conductive layer 19 and the second patterned conductive layer 20 by using a semi-additive process. Removal of the initial conductive layer 12 may be preferably effected using a quick-etch process as would be recognized by one skilled in the art. A semi-additive process is a well known process according to which, for example, a desmear treatment may be performed as necessary to roughen the surfaces of the starting insulating layer 10, and thereafter electroless plating may be performed onto the starting insulating layer 10 to form an electroless plating film (not shown), such as a electroless copper plating film, on the starting insulating layer 10. Then, a photoresist may be deposited on the electroless plating film, which photoresist may then be exposed to light and developed, whereby a resist pattern may be formed while leaving, on the starting insulating layer 10, a non-mask region corresponding to the pattern of the first and/or second patterned conductive layer. By means of electroplating, the electroless plating film may be used as a seed layer to stack an electroplated film in the non-mask regions. The resist pattern may then be removed by etching, and thereafter the electroless plating film which was till then covered with the resist pattern, may be removed by etching. In this way, the first and second patterned conductive layers 19 and 20 may be formed according to the second embodiment as shown in FIG. 10e.

Figure 9F:
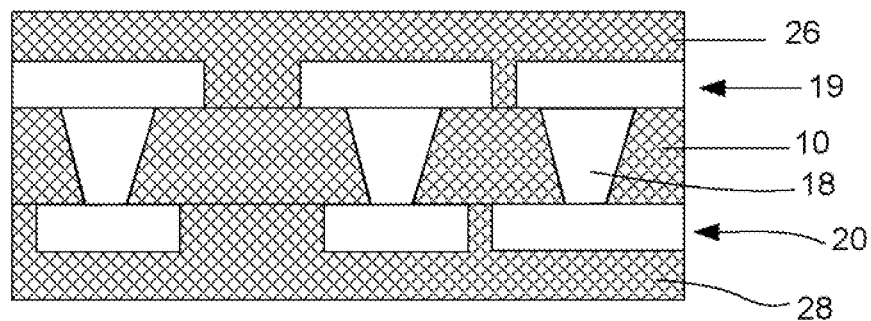
Figure 10F:
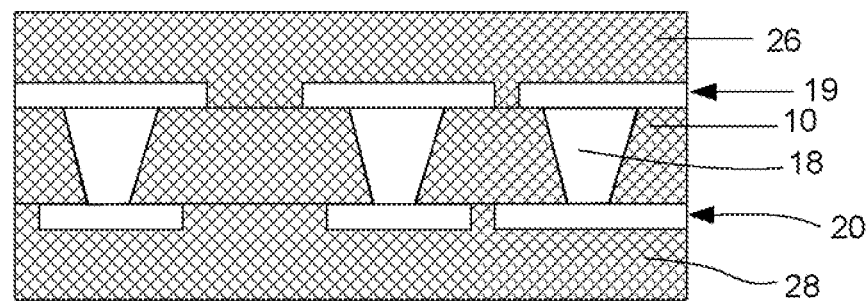

Referring next to FIGS. 9f and 10f, method embodiments include providing a supplemental insulating layer 26 onto the first patterned conductive layer 19. In some embodiments, as shown in FIGS. 9f and 10f, an additional supplemental insulating layer 28 may be provided onto the second patterned conductive layer 20 as shown. A supplemental insulating layer according to embodiments may include the same material as the one used for the starting insulating layer as noted above. According to an embodiment, provision of a supplemental insulating layer according to embodiments may include laminating the supplemental insulating layer onto a corresponding patterned conductive layer.

Figure 9G:
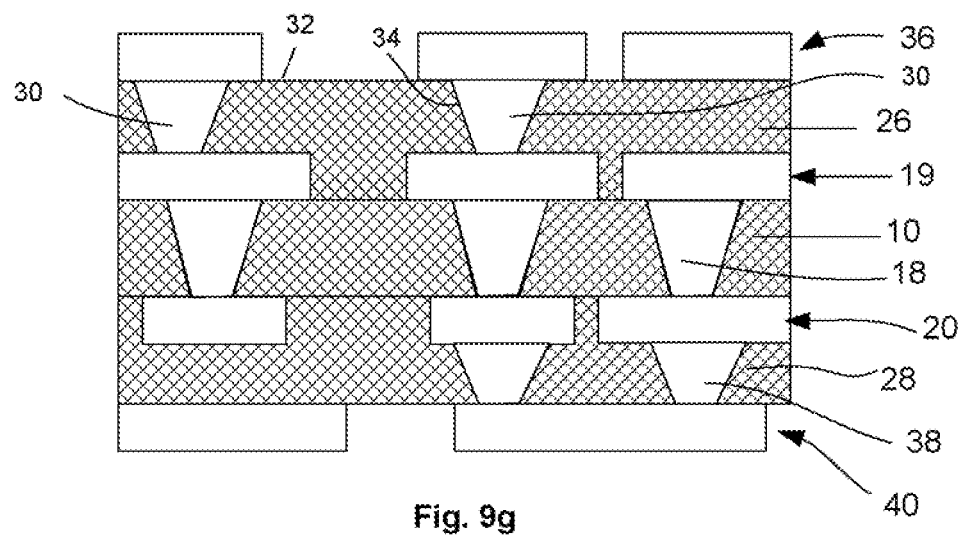
Figure 10G:
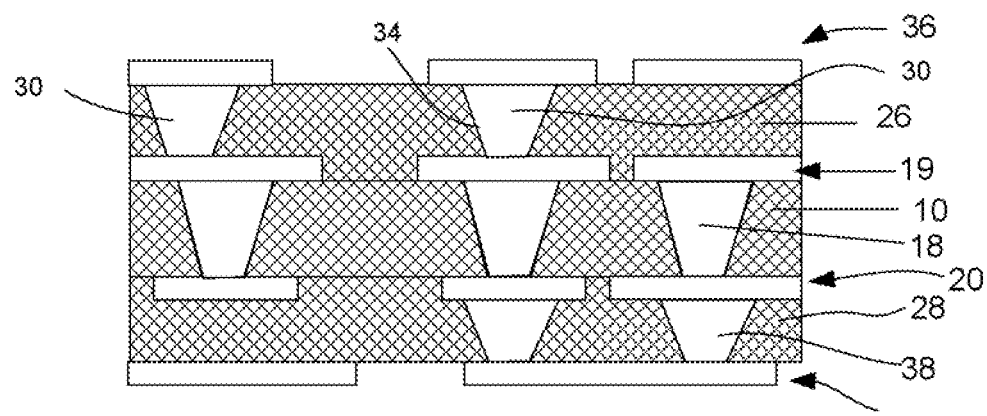

Referring next to FIGS. 9g and 10g, method embodiments include providing a second set of conductive vias 30 through the first supplemental insulating layer 26, and providing a supplemental patterned conductive layer 36 onto an exposed side 32 of the supplemental insulating layer 26, where the second set of conductive vias 30 contact the first patterned conductive layer 19 on one side thereof, and the supplemental patterned conductive layer 36 at another side thereof. Providing the second set of conductive vias 30 may include laser drilling a second set of via openings 34 through the supplemental insulating layer 26, the second set of via openings extending to the first patterned conductive layer. Thereafter, the second set of via openings 34 may be filled with a conductive material such as copper, silver and/or nickel, in order to provide the second set of conductive vias 30. Laser drilling may be accomplished for example in the same manner as described above in relation to FIGS. 9b and 10b, and the filling of the conductive material into the second set of via openings may further be accomplished, for the embodiment of FIG. 9g, for example in the same manner as described above with respect to FIG. 9c (by way of fast electroless plating), and for the embodiment of FIG. 10g for example in the same manner as described above with respect to FIG. 10c (by way of selective fast electroless plating). Provision of the supplemental patterned conductive layer 36 may be accomplished, for the embodiment of FIG. 9g for example in the same manner as described above with respect to FIG. 9e (by way of lamination of a conductive layer followed by etching of the same), and for the embodiment of FIG. 10g, for example in the same manner as described above with respect to FIG. 10e (by using a semi-additive process).

Optionally, referring still to FIGS. 9g and 10g according to a method embodiment, the supplemental insulating layer 26 is a first supplemental insulating layer, and the method embodiment includes providing a second supplemental insulating layer 28 onto the second patterned conductive layer 20 providing a third set of conductive vias 38 and providing a second supplemental patterned conductive layer 40 onto an exposed side 41 of the second supplemental insulating layer 28. According to the latter method embodiment, the third set of conductive vias 38 contacts the second supplemental patterned conductive layer 28 at one side thereof, and the second patterned conductive layer 20 at another side thereof. Provision of the second supplemental insulating layer 28 may be effected according to an embodiment in the same manner as described for the first supplemental insulating layer 26 above with respect to FIGS. 9f and 10f. In addition, the provision of the third set of conductive vias 38 may be accomplished, for the embodiment of FIG. 9g, for example in the same manner as described above for the first set of conductive vias 18 with respect to FIG. 9c (fast electroless plating), and for the embodiment of FIG. 10g, for example in the same manner as described for the first set of conductive vias 18 above with respect to FIG. 10c (by way of selective fast electroless plating).

Figure 9H:
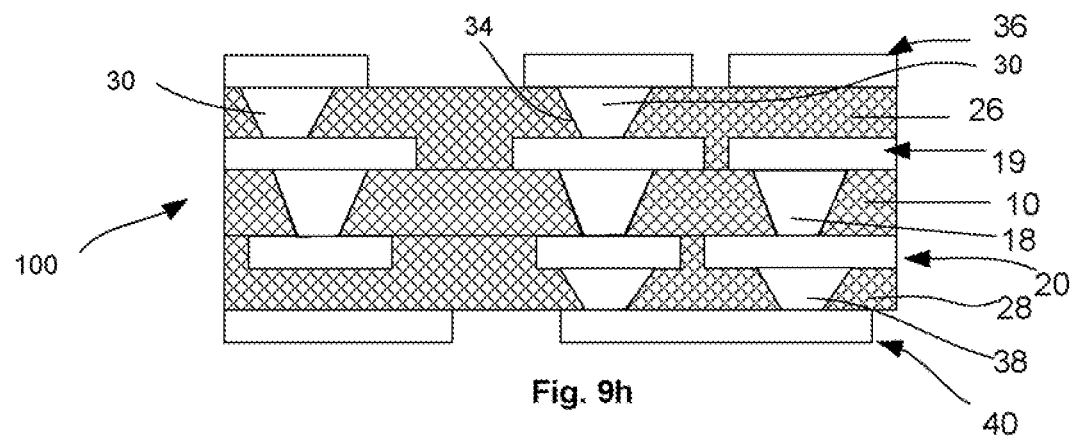
Figure 10H:
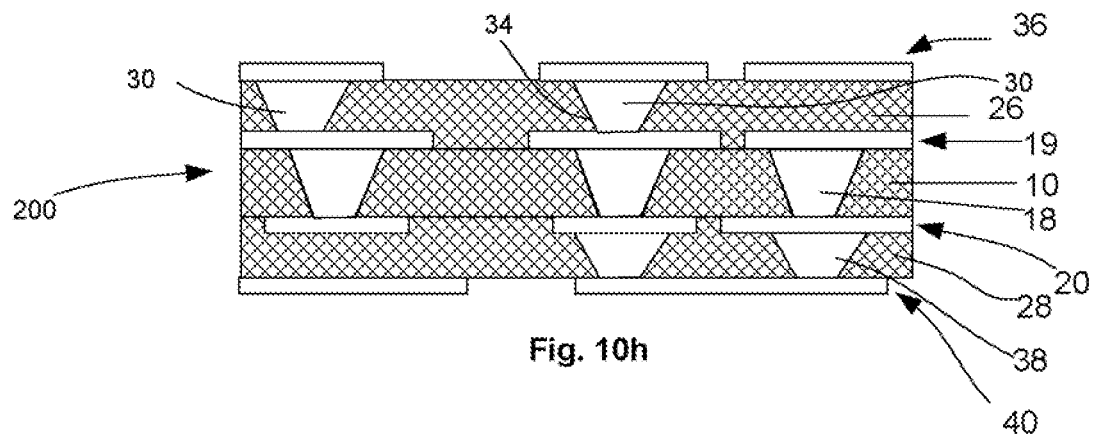

According to embodiments, the laser drilling of via openings results in laser drilled via openings which may exhibit, as shown in FIGS. 9h and 10h, a conical configuration, and further in eventual conductive vias which may extend sequentially in each given layer of a substrate core structure, as opposed to extending through a total thickness of the substrate core structure as in the case of prior art printed through holes. The above layer-by-layer or sequentially disposed configuration of conductive vias according to embodiments allows the provision of staggered vias as shown.

Although the substrate core structure structures shown in FIGS. 9h and 10h, respectively, show only two supplemental insulating layers, three sets of conductive vias, and four sets of patterned conductive layers, it is noted that embodiments are not so limited, and include within their ambit the provision of as many supplemental insulating layers, corresponding sets of conductive vias, and corresponding sets of patterned conductive layers as necessary in order to arrive at a desired substrate core structure structure. The provision of the various elements noted above, including the supplemental insulating layers, sets of conductive vias, and sets of patterned conductive layers may be effected as noted above either with respect to the first embodiment as shown in FIGS. 9a-9h, or with respect to the second embodiment as shown in FIGS. 10a-10h. In addition, although the second embodiment is described in relation to a preference of providing an initial conductive layer 12 onto the starting insulating layer 10 the second embodiment is not so limited, and includes the shown process flow in FIGS. 10a-10h without the initial conductive layer 12.

Referring now to FIGS. 9h and 10h, a method embodiment may include subjecting a combination of the starting insulating layer 10, the first set of conductive vias 18, the first patterned conductive layer 19, the second patterned conductive layer 20, the one or more supplemental insulating layers 26 and 28, the one or more additional sets of conductive vias (such as, for example, the second and third sets of conductive vias 30 and 38), and the one or more supplemental patterned conductive layers 36 and 40 to hot pressing in order to bond the conductive vias to pad sections of the patterned conductive layers. Hot pressing may be effected according to any one of well known methods for hot pressing, as would be recognized by one skilled in the art. Preferably, with increasing pressure, the temperature needed to form metallurgical bonding may be greatly reduced for embodiments, such as, for example, from about 400 degrees Celsius down to about 150 degrees Celsius to a range that the material of the starting insulating layer and supplemental insulating layers may endure. Preferably, the maximum temperature in hot pressing according to embodiments would not exceed about 260 degrees Celsius.

Advantageously, embodiments provide a method to enable building multilayer substrate core structures using laser drilled via openings optionally metallized by fast electroless metal plating. Embodiments address a new multilayer substrate core structures and a method of building the same in which the costly plated through hole structure is replaced with the low cost laser drilled microvias. Depending on the need for patterning fineness, two different method embodiments are proposed, as described above in relation to FIGS. 9a-9i on the one hand, and to FIGS. 10a-10i on the other hand. The first method embodiment as described by way of example in relation to FIGS. 9a-9i correspond to subtractive patterning for thick conductive layers such as thick copper (for example copper having a thickness between about 50 and about 70 microns) and for moderate line and space features (for example, line and space features above about 30 microns). The second method embodiment as described by way of example in relation to FIGS. 10a-10i corresponds to a semi additive patterning (SAP) process for thin conductive layers such as thin copper (e.g., a copper conductive layer having a thickness of less than about 2 microns) for fine line and space features (for example, line and space features less than about 30 microns). Embodiments effectively address among other things the problems of: (1) high cost prior art substrate core structures which use mechanical drilling technology by replacing the costly mechanically drilled plated through holes with low cost laser drilled microvias; (2) the need to laser drill through conductive layers such as copper by achieving low cost, shorter processing times, and high reliability of a laser drilled via core structure that obviates the need to laser drill through any of the conductive layers. An embodiment provides a lower cost method of fabrication than prior art methods by not only replacing the prior art plated through hole regime with laser drilled microvias, but also by reducing the core dielectric material thickness (by virtue of the generally reduced via dimensions and line and space features possible according to embodiments). In addition, laser drilling according to embodiments allows for higher starting insulating layer connection density as compared with prior art structures, owing to small via sizes and pitches, thus allowing for smaller sized vias and smaller pitches, in this way leading to an improved design and to scalable miniaturization at low cost. Laser drilling features high alignment accuracy (15 um POR), and through-put (up to about 2000 vias/sec), a wide range of possible via sizes (such as between about 50 microns and about 300 microns), and low cost (about 2 cents per one thousand vias). The combination of high alignment accuracy and small via size make possible via pitches as low as about 150 microns, those pitches being much less than typically plated through hole pitches of about 400 microns. Moreover, embodiments lead to substrate core structure substrate structures having potentially smaller form factors (by virtue of potentially smaller pitches, pad sizes, via dimensions), and a potentially smaller z-height (by virtue of potentially finer routing through the thickness of the insulating layers, which may lead to thinner insulating layers and/or the use of a smaller amount of insulating layers). Embodiments further make possible flexible core routing, to the extent that embodiments are not limited to vias which extend straight through the thickness of the totality of the insulating layers (as in the case of plated through holes of the prior art), but rather make possible a large number of possibilities with respect to through core routing configurations because the vias are provided in each of the insulating layers separately. The above advantageously leads to an improved substrate core structure design and potential performance benefits as compared with the prior art. In addition, via filling according to an embodiment using selective fast electroless copper plating on copper pads but not on dielectric areas may be advantageously enabled by a proper choice of catalysts so that only the copper area is seeded with the catalyst. While conventional electroless plating speeds, such as electroless copper plating speeds can be slow (about 4 to about 5 microns/hour), high speed or fast electroless plating solutions, such as fast electroless copper plating solutions, can allow plating at a speed as high as 2 microns per hour. Additionally, according to an embodiment, the use of a hot press advantageously allows the formation of a reliable metallurgical bond between the vias (whether copper, nickel or silver) and the pad, such as a copper pad.

Referring to FIG. 11, there is illustrated one of many possible systems 900 in which embodiments of the present invention may be used. In one embodiment, the electronic assembly 1000 may include a substrate core structure structure, such as structure 100 of FIG. 9h or structure 200 of FIG. 10h. Assembly 1000 may further include a microprocessor. In an alternate embodiment, the electronic assembly 1000 may include an application specific IC (ASIC). Integrated circuits found in chipsets (e.g., graphics, sound, and control chipsets) may also be packaged in accordance with embodiments of this invention.

For the embodiment depicted by FIG. 1, the system 900 may also include a main memory 1002, a graphics processor 1004, a mass storage device 1006, and/or an input/output module 1008 coupled to each other by way of a bus 1010, as shown. Examples of the memory 1002 include but are not limited to static random access memory (SRAM) and dynamic random access memory (DRAM). Examples of the mass storage device 1006 include but are not limited to a hard disk drive, a compact disk drive (CD), a digital versatile disk drive (DVD), and so forth. Examples of the input/output module 1008 include but are not limited to a keyboard, cursor control arrangements, a display, a network interface, and so forth. Examples of the bus 1010 include but are not limited to a peripheral control interface (PCI) bus, and Industry Standard Architecture (ISA) bus, and so forth. In various embodiments, the system 90 may be a wireless mobile phone, a personal digital assistant, a pocket PC, a tablet PC, a notebook PC, a desktop computer: a set-top box, a media-center PC, a DVD player, and a server.

The various embodiments described above have been presented by way of example and not by way of limitation. Having thus described in detail embodiments of the present invention, it is understood that the invention defined by the appended claims is not to be limited by particular details set forth in the above description, as many variations thereof are possible without departing from the spirit or scope thereof.

What is claimed is:

1. A method of fabricating a substrate core structure comprising:
   providing a starting insulating layer;
   forming an initial conductive layer on said starting insulating layer;
   laser drilling a first set of via openings through the starting insulating layer without laser drilling through said conductive layer such that said first set of via openings extend to said first conductive layer;
   filling the first set of via openings with a conductive material to provide a first set of conductive vias;
   after filling the first set of via openings, providing a first patterned conductive layer on one side of the starting insulating layer, and a second patterned conductive layer on another side of the starting insulating layer, the first set of conductive vias contacting the first patterned conductive layer at one side thereof, and the second patterned conductive layer at another side thereof;
   providing a first supplemental insulating layer onto the first patterned conductive layer and a second supplemental insulating layer on the second patterned conductive layer;
   laser drilling a second set of via openings through the first supplemental insulating layer, the via openings of the second set extending to the first patterned conductive layer and laser drilling a third set of via openings through the second supplemental insulating layer, the third set of via openings extending to the second patterned conductive layer;
   filling the second set of via openings with a conductive material to provide a second set of conductive vias and filling the third set of via openings with a conductive material to form a third set of conductive vias;
   providing a first supplemental patterned conductive layer onto an exposed side of the first supplemental insulating layer, the second set of conductive vias contacting the first patterned conductive layer at one side thereof and the first supplemental patterned conductive layer at another side thereof; and
   providing a second supplemental patterned conductive layer on the exposed side of the second supplemental insulating layer, the third set of conductive vias contacting the second patterned conductive layer at one side thereof and the second supplemental patterned conductive layer at another side thereof.

2. The method of claim 1, wherein providing the first supplemental insulating layer includes laminating the supplemental insulating layer.

3. The method of claim 1, wherein the first set of conductive vias, the first patterned conductive layer, the second patterned conductive layer, the second set of conductive vias and the first supplemental patterned conductive layer each comprise at least one of copper, nickel and silver.

4. The method of claim 1, wherein the starting insulating layer and the supplemental insulating layer each comprise at least one of a glass epoxy resin and bismaleimide-triazine (BT).

5. The method of claim 1, further comprising subjecting a combination of the starting insulating layer, the first set of conductive vias, the first patterned conductive layer, the second patterned conductive layer, the first supplemental insulating layer, the second supplemental insulating layer, the second set of conductive vias, the third set of conductive vias, the first supplemental patterned conductive layer and the second supplemental patterned conductive layer to hot pressing to bond the conductive vias to pad sections of the patterned conductive layers. patterned conductive layer each comprise at least one of copper, nickel and silver.

6. The method of claim 1, wherein filling the first set of via openings and filling the second set of via openings includes using fast electroless plating.

7. The method of claim 6, wherein fast electroless plating includes fast electroless copper plating.

8. The method of claim 1, wherein:
providing the first patterned conductive layer includes patterning the conductive layer by way of etching; and
providing the second patterned conductive layer includes:
providing a second conductive layer onto said another side of the starting insulating layer; and
patterning the second conductive layer by way of etching.

9. The method of claim 8, wherein providing a second conductive layer comprises laminating the second conductive layer.

10. The method of claim 1, wherein:
providing the first patterned conductive layer includes:
removing, by way of etching, the initial conductive layer after filling the first set of via openings by way of etching;
providing the first patterned conductive layer by using a semi-additive process; and
providing the second patterned conductive layer by using a semi-additive process.

11. The method of claim 10, wherein the initial conductive layer has a thickness between about 1 and about 2 microns.

12. The method of claim 10, wherein removing the initial conductive layer comprises q-etching the initial conductive layer.

13. The method of claim 10, wherein filling the first set of via openings and filling the second set of via openings includes using selective fast electroless copper plating.

* * * * *

UNITED STATES PATENT AND TRADEMARK OFFICE
CERTIFICATE OF CORRECTION

PATENT NO. : 8,877,565 B2  
APPLICATION NO. : 11/769852  
DATED : November 4, 2014  
INVENTOR(S) : Li et al.

Page 1 of 1

It is certified that error appears in the above-identified patent and that said Letters Patent is hereby corrected as shown below:

In the claims

Claim 5, column 8

Lines 60-68 read "The method of claim 1, further comprising subjecting a combination of the starting insulating layer, the first set of conductive vias, the first patterned conductive layer, the second patterned conductive layer, the first supplemental insulating layer, the second supplemental insulating layer, the second set of conductive vias, the third set of conductive vias, the first supplemental patterned conductive layer and the second supplemental patterned conductive layer to hot pressing to bond the conductive vias to pad sections of the patterned conductive layers. patterned conductive layer each comprise one of copper, nickel and silver."

should read -- The method of claim 1, further comprising subjecting a combination of the starting insulating layer, the first set of conductive vias, the first patterned conductive layer, the second patterned conductive layer, the first supplemental insulating layer, the second supplemental insulating layer, the second set of conductive vias, the third set of conductive vias, the first supplemental patterned conductive layer and the second supplemental patterned conductive layer to hot pressing to bond the conductive vias to pad sections of the patterned conductive layers. --.

Signed and Sealed this
Fifteenth Day of December, 2015

Michelle K. Lee
*Director of the United States Patent and Trademark Office*